United States Patent
Ha et al.

(10) Patent No.: US 11,744,017 B2
(45) Date of Patent: Aug. 29, 2023

(54) ELECTRONIC DEVICE INCLUDING INTERPOSER

(71) Applicant: Samsung Electronics Co., Ltd., Suwon-si (KR)

(72) Inventors: Sangwon Ha, Suwon-si (KR); Subyung Kang, Suwon-si (KR); Sanghoon Park, Suwon-si (KR); Soohyun Seo, Suwon-si (KR); Yongjin Woo, Suwon-si (KR); Yeomoon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 462 days.

(21) Appl. No.: 16/868,941

(22) Filed: May 7, 2020

(65) Prior Publication Data
US 2021/0022247 A1   Jan. 21, 2021

(30) Foreign Application Priority Data
Jul. 17, 2019   (KR) ........................ 10-2019-0086151

(51) Int. Cl.
*H05K 1/14* (2006.01)
*H01L 23/40* (2006.01)

(52) U.S. Cl.
CPC ............. *H05K 1/145* (2013.01); *H05K 1/144* (2013.01); *H01L 2023/4087* (2013.01)

(58) Field of Classification Search
CPC ......... H05K 1/145; H05K 1/111; H05K 1/144
See application file for complete search history.

(56) References Cited

U.S. PATENT DOCUMENTS

| 10,342,131 B1 | 7/2019 | Kim et al. |
| 10,602,612 B1 * | 3/2020 | Hoang ................... H05K 3/284 |
| 2006/0091510 A1 | 5/2006 | Liu et al. |
| 2011/0266586 A1 | 11/2011 | Shen et al. |
| 2012/0243195 A1 | 9/2012 | Lim et al. |

(Continued)

FOREIGN PATENT DOCUMENTS

| JP | 2004-014648 A | 1/2004 |
| KR | 10-2010-0082551 A | 7/2010 |

(Continued)

OTHER PUBLICATIONS

International Search Report dated Aug. 14, 2020, issued in International Application No. PCT/KR2020/006014.

(Continued)

*Primary Examiner* — Hoa C Nguyen
(74) *Attorney, Agent, or Firm* — Jefferson IP Law, LLP

(57) ABSTRACT

An electronic device is provided. The electronic device includes a housing, a first printed circuit board disposed in an internal space of the housing and including first conductive terminals, and a second printed circuit board disposed parallel to the first printed circuit board in the internal space and including second conductive terminals electrically connected to the first conductive terminals. The second printed circuit board includes at least some conductive terminals of the second conductive terminals, or at least one connection failure prevention structure disposed around at least some conductive terminals of the second conductive terminals.

19 Claims, 17 Drawing Sheets

(56) References Cited

U.S. PATENT DOCUMENTS

| | | | | |
|---|---|---|---|---|
| 2013/0134606 A1* | 5/2013 | Im | ............................ | H01L 24/73 |
| | | | | 257/734 |
| 2018/0012838 A1* | 1/2018 | Arvin | ....................... | H01L 24/48 |
| 2018/0092213 A1 | 3/2018 | Provencher et al. | | |
| 2019/0021167 A1* | 1/2019 | Yamamoto | .............. | H01L 24/16 |
| 2019/0029122 A1 | 1/2019 | Len et al. | | |
| 2019/0082536 A1 | 3/2019 | Park et al. | | |
| 2019/0334231 A1 | 10/2019 | Sakurai | | |

FOREIGN PATENT DOCUMENTS

| | | |
|---|---|---|
| KR | 10-2012-0108827 A | 10/2012 |
| KR | 10-2018-0080468 A | 7/2018 |
| KR | 10-2019-0059984 A | 5/2019 |

OTHER PUBLICATIONS

Extended European Search Report dated Jul. 27, 2022, issued in European Patent Application No. 20840654.6-1211.
Korean Office Action dated Jul. 3, 2023, issued in Korean Patent Application No. 10-2019-0086151.

\* cited by examiner

ELECTRONIC DEVICE INCLUDING INTERPOSER

CROSS-REFERENCE TO RELATED APPLICATION(S)

This application is based on and claims priority under 35 U.S.C. § 119 to Korean patent application number 10-2019-0086151, filed on Jul. 17, 2019, in the Korean Intellectual Property Office, the disclosure of which is incorporated by reference herein in its entirety.

BACKGROUND

1. Field

The disclosure relates to an electronic device including an interposer.

2. Description of Related Art

In recent years, electronic devices are gradually becoming slim and improved to increase rigidity thereof. In particular, it is important that the electronic device enables an effective electrical connection between electronic components disposed therein, and has a robust structure capable of maintaining an electrical connection between electronic components even by an external impact.

An electronic device may include at least one electronic component disposed in an internal space thereof. In order to perform a corresponding function of the electronic device, at least one electronic component may be electrically connected to each other. Such electronic components may include at least two printed circuit boards disposed in the internal space of the electronic device. In order to secure an efficient mounting space, printed circuit boards may be disposed in a stacked manner and be electrically connected to each other by an interposer disposed therebetween. For example, each printed circuit board may include a plurality of conductive terminals, and physically contact a plurality of corresponding conductive terminals disposed at a corresponding surface of the interposer, whereby the two printed circuit boards may be electrically connected. For contact between the plurality of conductive terminals, the conductive terminals may be electrically connected through a solder. For example, two components (conductive terminals) joined by the solder should not be disconnected or be externally invaded during soldering. In a soldering process, a solder may be disposed between two components and the two components may be joined by the solder.

The interposer and the printed circuit board may physically attach a pre-solder previously disposed in each conductive terminal through a reflow process to be electrically connected to each other. For example, a pre-solder (preliminary solder) such as SnSb, SnBi, SnAg, SnAgCu, or pure Sn may be disposed at each of the conductive terminals in a form of a curved surface. Such a pre-solder may contact each other in a molten state through a reflow process by entire or local heating of a printed circuit board at a specific temperature (e.g., 180° C. to 210° C.) to electrically connect the conductive terminals.

However, because of narrowing of spacing between electronic components according to slimness of the electronic device, a size of the terminal becomes smaller or a spacing between the terminals is also narrowed, thus, upon reflow, a physical contact between terminals through a free solder may not be performed (electrical open phenomenon) or free solders of an excessive amount may be in physical contact with each other (electrical short phenomenon).

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including an interposer.

Another aspect of the disclosure is to provide a printed circuit board stacked structure using an interposer and an electronic device including the same.

Another aspect of the disclosure is to provide an electronic device including an interposer capable of smoothly performing electrical connections between printed circuit boards through a change in an appropriate structure disposed around terminals.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first printed circuit board disposed in an internal space of the housing and including a plurality of first conductive terminals, and a second printed circuit board disposed parallel to the first printed circuit board in the internal space and including a plurality of second conductive terminals electrically connected to the plurality of first conductive terminals, wherein the second printed circuit board includes at least some conductive terminals of the plurality of second conductive terminals or at least one connection failure prevention structure disposed around at least some conductive terminals.

In accordance with another aspect of the disclosure, an interposer is provided. The interposer includes a dielectric substrate including a first surface, and a second surface facing in a direction opposite to that of the first surface, at least one first conductive terminal disposed at the first surface, at least one second conductive terminal disposed at the second surface, and at least one support structure disposed around the at least one first conductive terminal and/or the at least one second conductive terminal.

In accordance with another aspect of the disclosure, an electronic device is provided. The electronic device includes a housing, a first printed circuit board disposed in an internal space of the housing and including a plurality of first conductive terminals, a second printed circuit board disposed parallel to the first printed circuit board in the internal space and including a plurality of second conductive terminals, and an interposer disposed to electrically connect the first printed circuit board and the second printed circuit board between the first printed circuit board and the second printed circuit board, wherein the interposer includes a dielectric substrate including a first surface and a second surface facing in a direction opposite to that of the first surface, a plurality of third conductive terminals disposed to be electrically connected to the plurality of first conductive terminals at the first surface, a plurality of fourth conductive terminals disposed to be electrically connected to the plurality of second conductive terminals at the second surface, and at least one solder overflow prevention structure disposed around at least some conductive terminals of the plurality of first conductive terminals, the plurality of second conductive terminals, the plurality of third conductive terminals, and/or the plurality of fourth conductive terminals.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
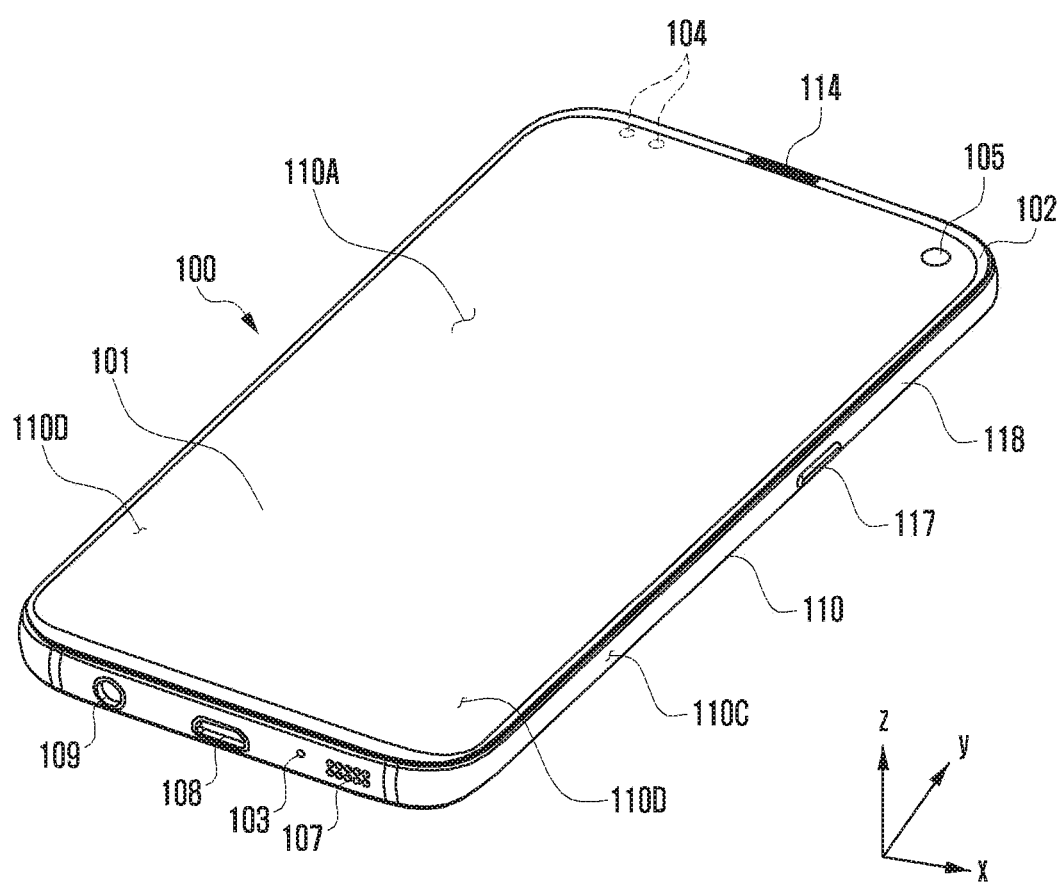
FIG. 1 is a perspective view illustrating a front surface of a mobile electronic device according to an embodiment of the disclosure.

FIG. 1 illustrates a perspective view showing a front surface of a mobile electronic device according to an embodiment of the disclosure.

Figure 2:
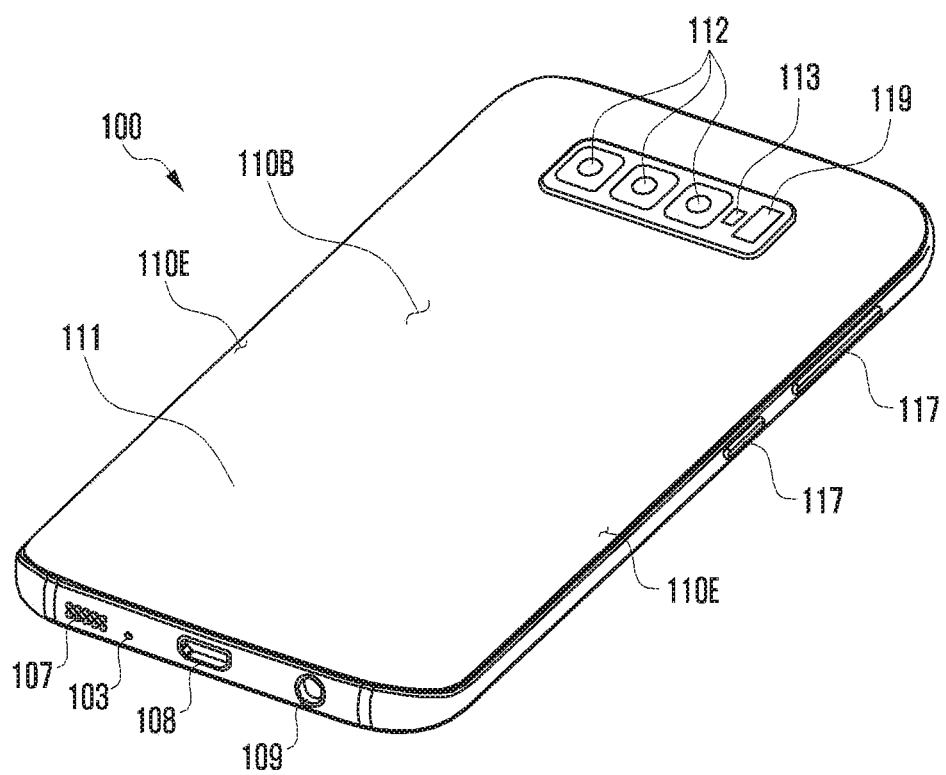
FIG. 2 is a perspective view illustrating a rear surface of the electronic device of FIG. 1 according to an embodiment of the disclosure.

FIG. 2 illustrates a perspective view showing a rear surface of the mobile electronic device shown in FIG. 1 according to an embodiment of the disclosure.

Referring to FIGS. 1 and 2, an electronic device such as a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera device 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an infrared light emitting diode (IR LED), or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules of camera modules 105 and 112, some sensor modules of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
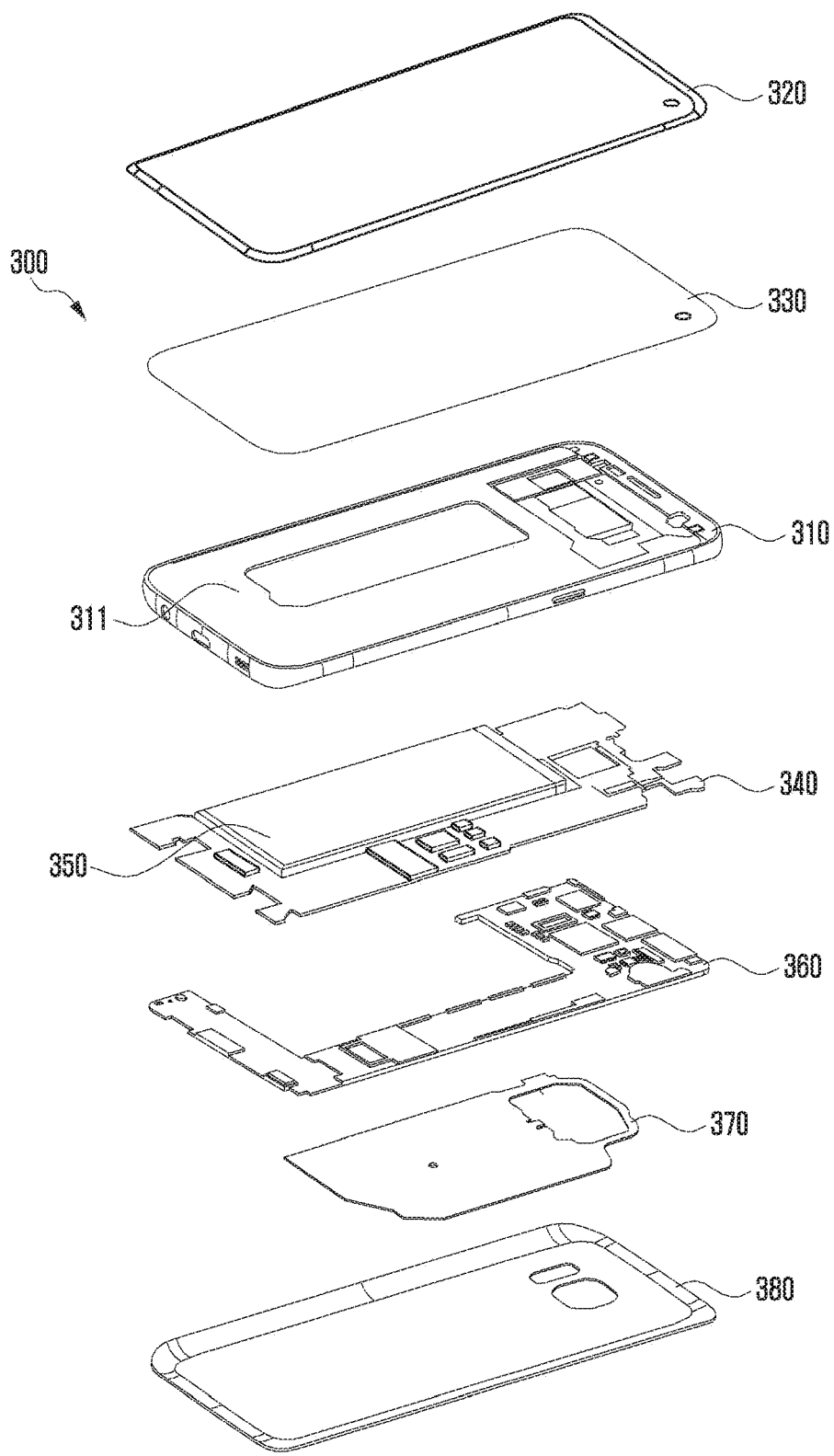
FIG. 3 is an exploded perspective view illustrating the electronic device of FIG. 1 according to an embodiment of the disclosure.

FIG. 3 illustrates an exploded perspective view showing a mobile electronic device shown in FIG. 1 according to an embodiment of the disclosure.

Referring to FIG. 3, an electronic device such as a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 310 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
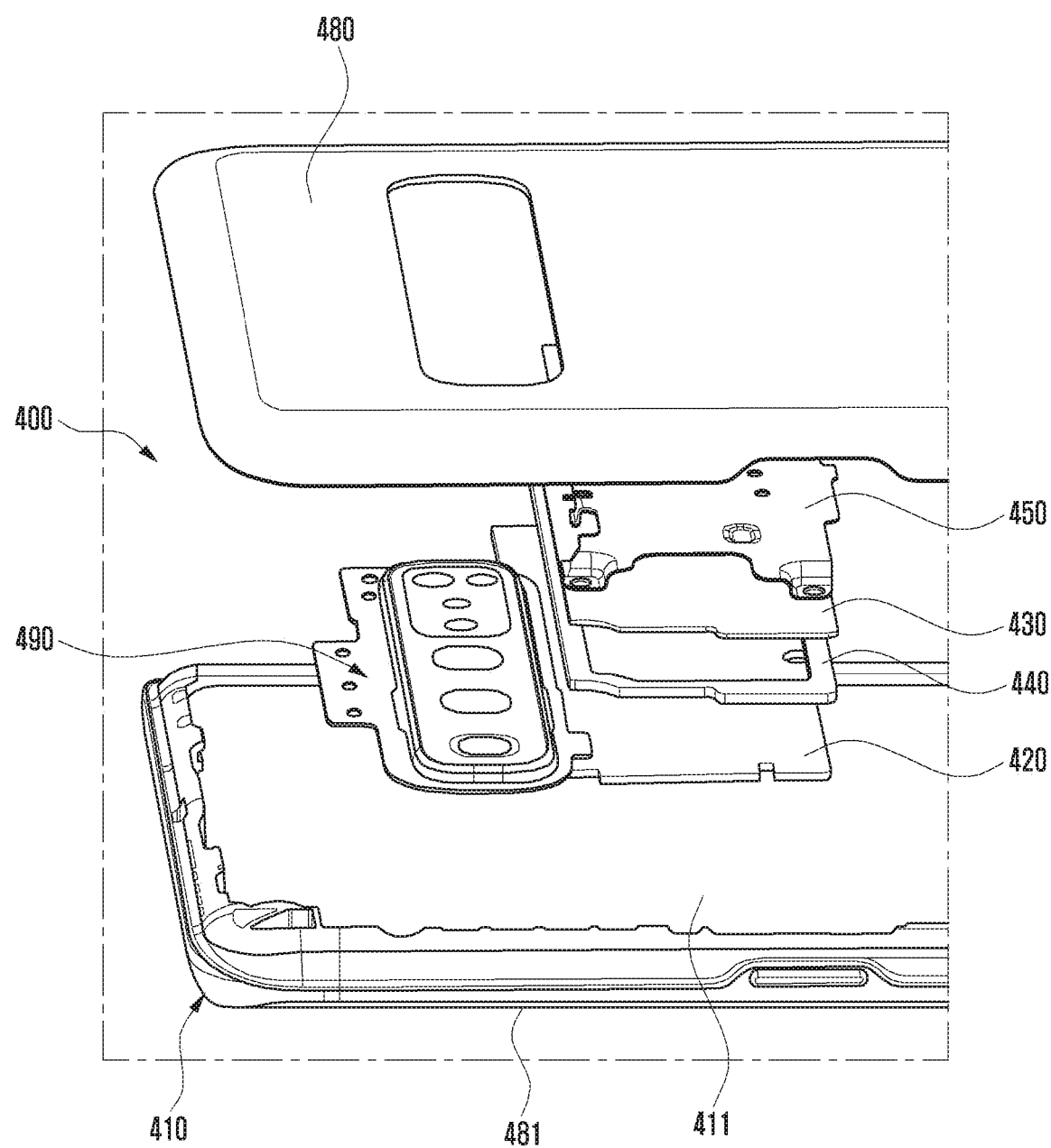
FIG. 4 is a diagram illustrating an electronic device to which an interposer is applied according to embodiment of the disclosure.

FIG. 4 is a diagram illustrating an electronic device 400 to which an interposer 440 is applied according to an embodiment of the disclosure.

Referring to FIG. 4, the electronic device 400 of FIG. 4 may be at least partially similar to the electronic device 100 of FIGS. 1 and 2 or the electronic device 300 of FIG. 3 or may include other components of the electronic device.

Referring to FIG. 4, the electronic device 400 (e.g., the electronic device 300 of FIG. 3) may include a housing structure (e.g., the housing 110 of FIG. 1A) including a front cover 481 (e.g., the front plate 320 of FIG. 3), a rear cover 480 (e.g., the rear plate 380 of FIG. 3) facing in a direction opposite to that of the front cover 481, and a side member 410 (e.g., the side member (e.g., the lateral bezel structure 310) of FIG. 3) enclosing a space between the front cover 481 and the rear cover 480. According to an embodiment, the electronic device 400 may include a first support member 411 (e.g., the first support member 311 of FIG. 3) disposed in an internal space. According to one embodiment, the first support member 411 may be disposed to extend from the side member 410 to the internal space. In another embodiment, the first support member 411 may be separately provided in the internal space of the electronic device 400. According to one embodiment, the first support member 411 may be extended from the side member 410 and at least some areas thereof may be made of a conductive material. According to an embodiment, the electronic device 400 may include a camera structure 490 disposed in a space between the front cover 481 and the rear cover 480.

According to various embodiments, the electronic device 400 may include a pair of printed circuit boards 420 and 430 disposed between the first support member 411 and the rear cover 480 in the internal space. According to one embodiment, when viewed from above the front cover 481, the pair of printed circuit boards 420 and 430 may be disposed such that at least some areas overlap. According to an embodiment, the pair of printed circuit boards 420 and 430 may include a first printed circuit board 420 (e.g., main board) disposed between the first support member 411 and the rear cover 480 and a second printed circuit board 430 (e.g., sub-board) disposed between the first printed circuit board 420 and the rear cover 480.

According to various embodiments, the electronic device 400 may include an interposer 440 interposed between the first printed circuit board 420 and the second printed circuit board 430. According to one embodiment, the interposer 440 may include a plurality of conductive terminals, physically contacts conductive terminals disposed at two printed circuit boards 420 and 430 through a pre-solder, thereby electrically connecting the two printed circuit boards 420 and 430. For example, the interposer 440 may be preferentially mounted in the first printed circuit board 420 through the pre-solder applied to the conductive terminal. In another embodiment, the interposer 440 may be preferentially mounted in the second printed circuit board 430 through the pre-solder applied to the conductive terminal. According to an embodiment, the electronic device 400 may include a second support member 450 disposed between the second printed circuit board 430 and the rear cover 480. According to one embodiment, the second support member 450 may be disposed at a position at least partially overlapped with the second printed circuit board 430. According to one embodiment, the second support member 450 may include a metal plate. Therefore, the first printed circuit board 420, the interposer 440, and the second printed circuit board 430 may be fixed to the first support member 411 through the second support member 450 disposed thereon. For example, the second support member 450 may be fastened to the first support member 411 through a fastening member such as a screw, thereby firmly supporting an electrical connection between the first printed circuit board 420, the interposer 440, and the second printed circuit board 430.

Hereinafter, the interposer 440 will be described in detail.

Figure 5:
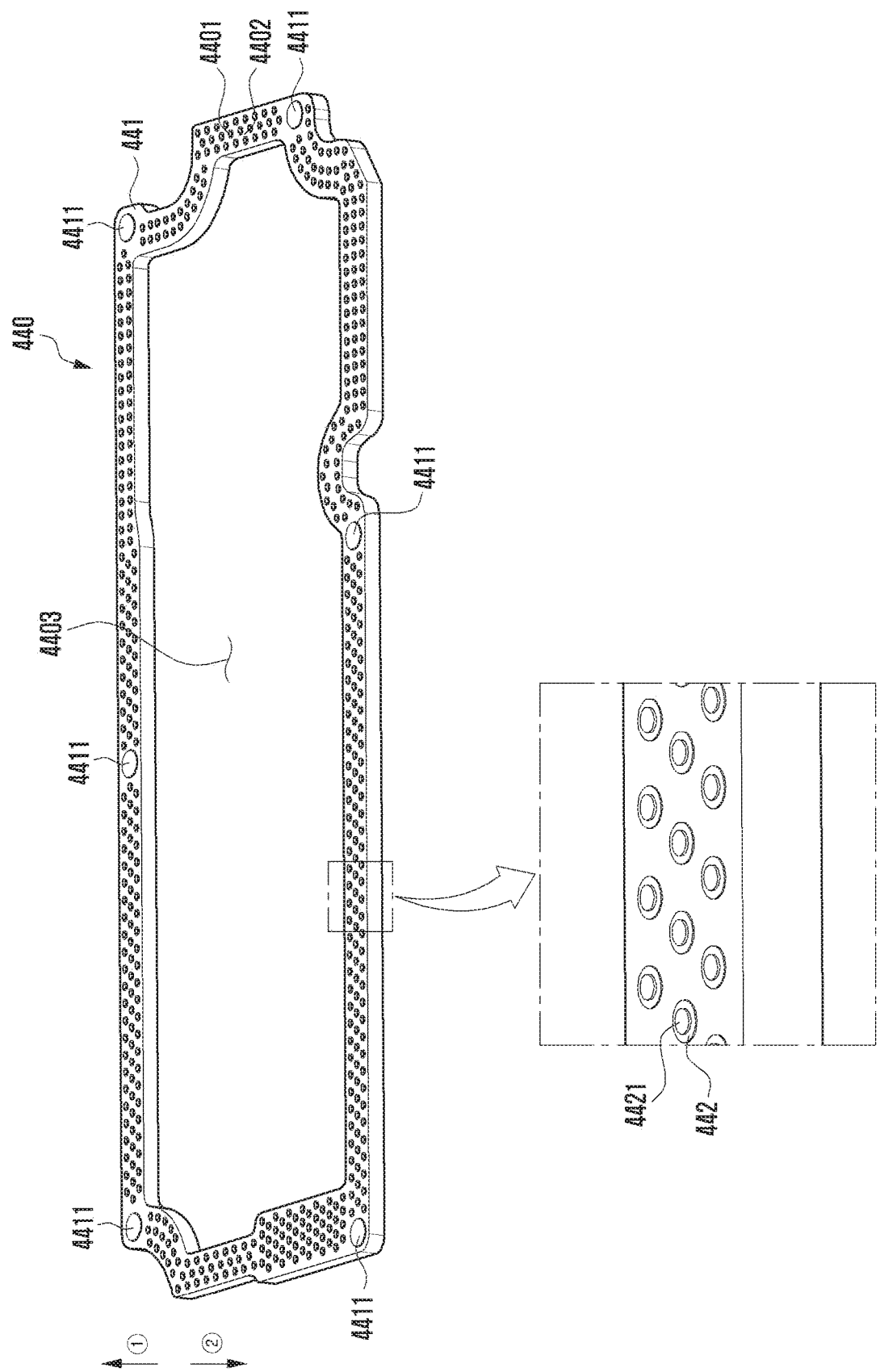
FIG. 5 is a perspective view illustrating an interposer according to an embodiment of the disclosure.

FIG. 5 is a perspective view illustrating an interposer 440 according to an embodiment of the disclosure.

Referring to FIG. 5, the interposer 440 may include a dielectric substrate 441 including a first surface 4401 facing in a first direction (① direction) and a second surface 4402 facing in a direction (② direction) opposite to that of the first surface 4401. According to one embodiment, the interposer 440 may include a plurality of conductive terminals 442 (e.g., the third conductive terminals 442 and fourth conductive terminals 443 of FIG. 6A) disposed at the first surface 4401 and the second surface 4402 at regular or irregular intervals and exposed to the outside. According to one embodiment, the plurality of conductive terminals 442 may have different sizes, and be disposed to have regular or irregular intervals. For example, at least one conductive terminal connected to the ground among the plurality of conductive terminals 442 may be formed to be larger than at least one conductive terminal used for signal transmission. According to one embodiment, the plurality of conductive terminals 442 may be electrically connected through conductive posts (e.g., conductive posts 444 of FIG. 6A) (e.g., conductive vias) penetrated from the first surface 4401 to the second surface 4402 of the dielectric substrate 441. According to one embodiment, the interposer 440 may include at least one screw fastening portion 4411 disposed at least partially. According to one embodiment, the interposer 440 may be fixed to at least one support structure (e.g., the first support member 411 and/or the second support member 450 of FIG. 4) disposed inside the electronic device (e.g., the electronic device 400 of FIG. 4) through a screw fastening portion 4411.

According to various embodiments, the interposer 440 may have substantially the same shape as that of at least one printed circuit board of a first printed circuit board (e.g., the first printed circuit board 420 of FIG. 4) or a second printed circuit board (e.g., the second printed circuit board 430 of FIG. 4) and include an opening 4403 formed in the center. In another embodiment, the interposer 440 may be formed at least partially differently in shape from at least one printed circuit board of a first printed circuit board (e.g., the first printed circuit board 420 of FIG. 4) or a second printed circuit board (e.g., the second printed circuit board 430 of FIG. 4). According to one embodiment, the opening 4403 may be used as a reception space for receiving electronic components (e.g., various electrical elements or shield cans) disposed in at least one of the two printed circuit boards 420 and 430.

According to various embodiments, the interposer 440 may include a connection failure prevention structure disposed in a manner stacked on the plurality of conductive terminals 442. According to an embodiment, the connection failure prevention structure may include at least one support terminal 4421 overlapped on each conductive terminal 442. According to one embodiment, the at least one support terminal 4421 may include a multistage structure of one or two or more stages disposed in a stacked manner. According to an embodiment, the at least one support terminal 4421 may be formed at an upper surface of the conductive terminal 442 through pattern plating. For example, the at least one support terminal 4421 may perform masking through a dry film on the conductive terminal 442, and form a support terminal at a predetermined height through a pattern plating process and then be formed by removing the dry film through an etching process.

Figure 6A:
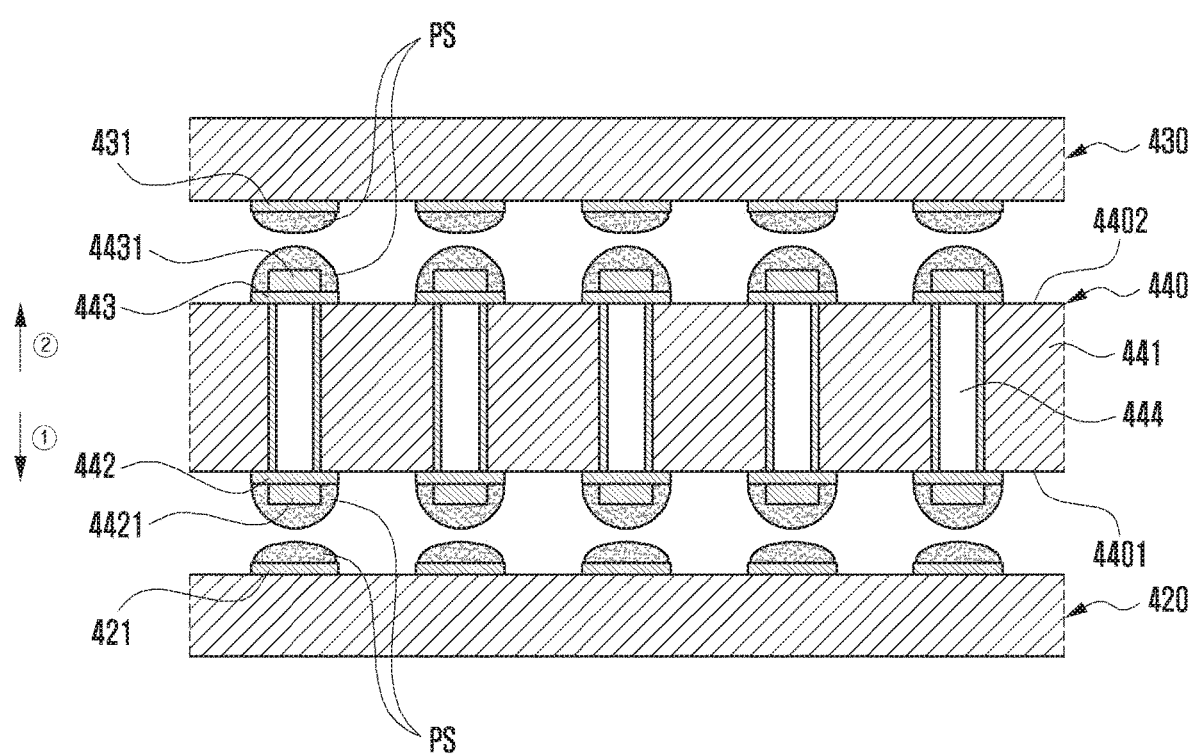
FIGS. 6A and 6B are partial cross-sectional views illustrating a configuration and a coupled state between an interposer and printed circuit boards according to various embodiments of the disclosure.
Figure 6B:
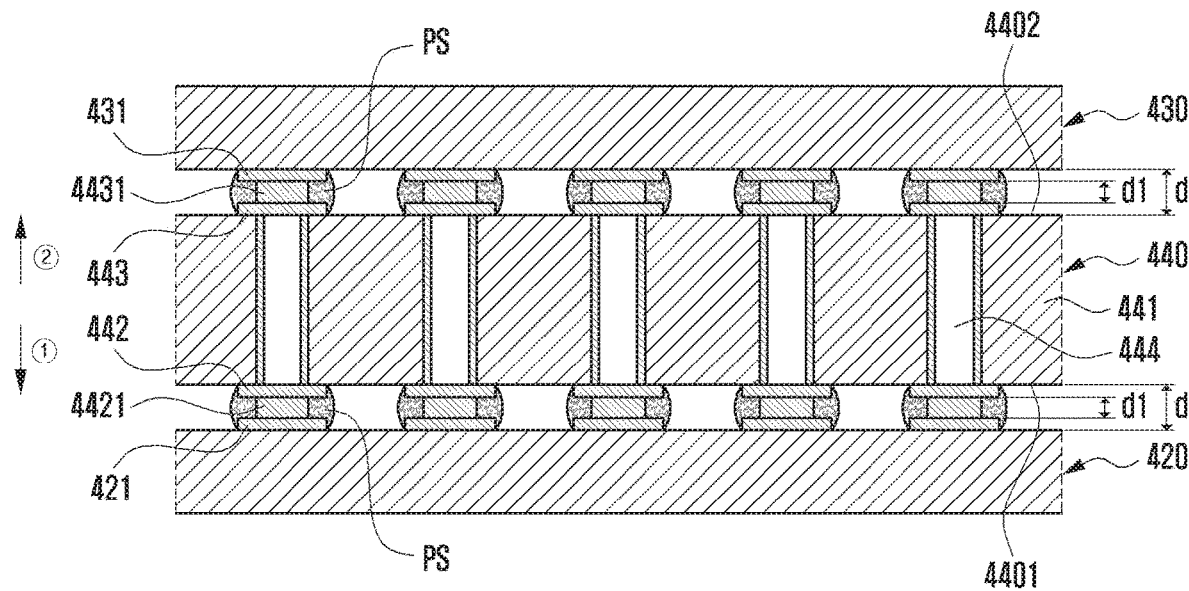

FIGS. 6A and 6B are partial cross-sectional views illustrating a configuration and a coupled state between an interposer 440 and printed circuit boards 420 and 430 according to various embodiments of the disclosure.

Referring to FIGS. 6A and 6B, an electronic device (e.g., the electronic device 400 of FIG. 4) may include a first printed circuit board 420 disposed in an internal space and including a plurality of first conductive terminals 421, a second printed circuit board 430 disposed substantially parallel to the first printed circuit board 420 and including a plurality of second conductive terminals 431, and an interposer 440 disposed to electrically connect the first printed circuit board 420 and the second printed circuit board 430 between the first printed circuit board 420 and the second printed circuit board 430.

According to various embodiments, the interposer 440 may include a dielectric substrate 441 including a first surface 4401 facing the first printed circuit board 420 (e.g., main board) and a second surface 4402 facing in a direction opposite to that of the first surface 4401 and facing the second printed circuit board 430 (e.g., sub-board). According to an embodiment, the interposer 440 may include a plurality of third conductive terminals 442 disposed at the first surface 4401 so as to face the plurality of first conductive terminals 421, respectively disposed at one surface of the first printed circuit board 420. According to one embodiment, the interposer 440 may include a plurality of fourth conductive terminals 443 disposed at the second surface 4402 so as to face the plurality of second conductive terminals 431, respectively disposed at one surface of the second printed circuit board 430. According to one embodiment, each of the plurality of third conductive terminals 442 and the plurality of fourth conductive terminals 443 may be electrically connected through the conductive post 444 (e.g., conductive via) disposed to penetrate from the first surface 4401 of the dielectric substrate 441 to the second surface 4402. According to one embodiment, the interposer 440 may include a pre-solder (PS) disposed so that the plurality of third conductive terminals 442 are electrically and physically connected to the plurality of first conductive terminals 421 and that the plurality of fourth conductive terminals 443 are electrically and physically connected to the plurality of second conductive terminals 431. According to one embodiment, when the first printed circuit board 420 and the second printed circuit board 430 are coupled to the interposer 440, the pre-solder PS may bind terminals to each other through a reflow process. According to one embodiment of the disclosure, the reflow process is to supply in advance a solder to a land of a board and to melt and connect the solder with an external heat source, which may be a process for soldering to the circuit board. According to one embodiment of the disclosure, the soldering process is not limited to reflow soldering, and various methods such as flow soldering other than reflow soldering may be used.

According to various embodiments, the interposer 440 may include at least one support terminal 4421 and 4431 disposed to be stacked on each of the plurality of third conductive terminals 442 and the plurality of fourth conductive terminals 443. According to an embodiment, at least one support terminal 4421 and 4431 may be disposed to extend to a predetermined height (e.g., dl of FIG. 6B) from the conductive terminals 442 and 443, and when the printed circuit boards 420 and 430 are in contact with each other through the interposer 440, at least one support terminal 4421 and 4431 may induce to have a predetermined interval (e.g., d of FIG. 6B) including an added height dl. According to one embodiment, when the interposer 440 and the printed circuit boards 420 and 430 are coupled, at least one support terminal 4421 and 4431 may enable to maintain a uniform distance (e.g., distance d) and prevent a non-uniform distance from occurring between the interposer 440 and the printed circuit boards 420 and 430 through an external impact, thereby helping prevent an electric open phenomenon or an electric short phenomenon. Further, a contact area of the pre-solder PS is extended through at least one support terminal 4421 and 4431, which may be advantageous to external impacts such as falling of the electronic device.

According to one embodiment of the disclosure, the support terminals 4421 and 4431 may serve as a support for maintaining a shape of the pre-solder PS. According to one embodiment of the disclosure, when the pre-solder PS formed in an outer edge in which the support terminals 4421 and 4431 are disposed is supported to have a predetermined shape by the support terminal, stability of an electrical connection of at least one printed circuit board 420 and 430 and at least one conductive terminal 421, 431, 442, and 443 may be relatively higher than that of absence of the support terminals 4421 and 4431.

In another embodiment, at least one support terminal 4421 and 4431 may be added to or may be replaced with the first conductive terminals 421 of the first printed circuit board 420 and/or the second conductive terminals 431 of the second printed circuit board 430.

According to one embodiment of the disclosure, a structure in which at least one support terminal is disposed may be formed such that the maximum distance d is maintained substantially equally in a minimal disposition. According to one embodiment of the disclosure, the distance d or dl formed between the second printed circuit board 430 and the interposer 440 and the distance d or dl formed between the first printed circuit board 420 and the interposer 440 may be formed to be substantially the same, but may be formed at different distances according to a disposition structure or a situation of the electronic device.

Figure 7A:
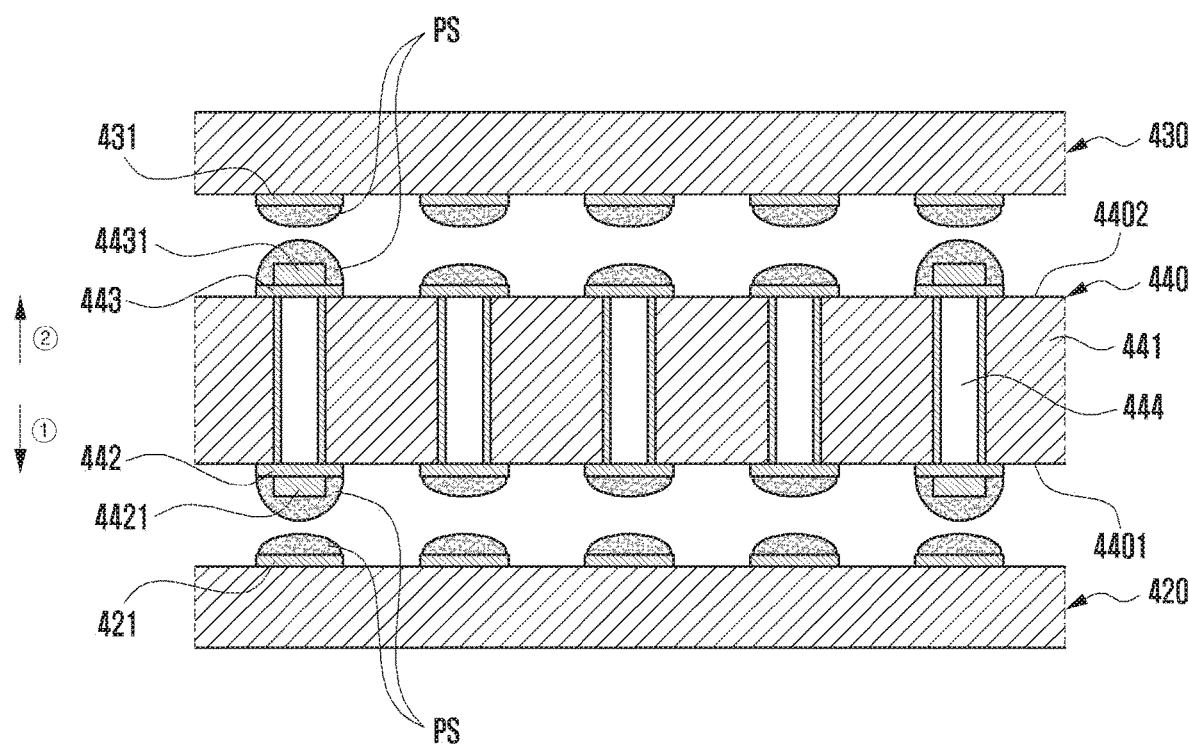
FIGS. 7A and 7B are partial cross-sectional views illustrating a configuration and a coupled state between an interposer and printed circuit boards according to various embodiments of the disclosure.
Figure 7B:
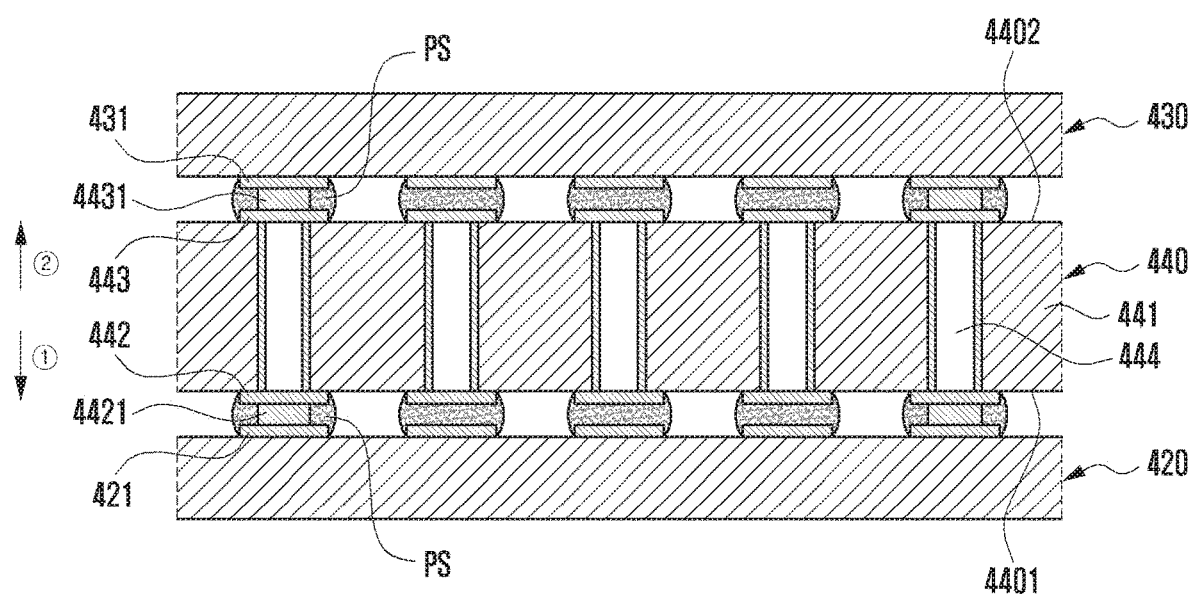

FIGS. 7A and 7B are partial cross-sectional views illustrating a configuration and a coupled state between an interposer 440 and printed circuit boards 420 and 430 according to various embodiments of the disclosure.

Referring to FIGS. 7A and 7B, they may be substantially the same as the configurations of FIGS. 6A and 6B, and at least one support terminal 4421 and 4431 may be disposed in conductive terminals 442 and 443 spaced apart at regular intervals instead of all of a plurality of third conductive terminals 442 and a plurality of fourth conductive terminals 443.

According to one embodiment of the disclosure, the at least one support terminal 4421 and 4431 may be formed in at least a portion of the conductive terminals 421, 431, 442, and 443 of the first printed circuit board 420. For example, a forming portion of the support terminal is not formed in all of the conductive terminals of the printed circuit board, but is disposed at an outermost portion (e.g., corner or edge) of the circuit boards and when the first printed circuit board 420 and the second printed circuit board 430 are coupled, the first printed circuit board 420 and the second printed circuit board 430 may be formed to maintain substantially parallel or to maintain the distance d to be substantially the same.

The first printed circuit board 420 and the second printed circuit board 430 coupled to the interposer 440 through such a disposition structure maintain a predetermined distance from the interposer 440 and thus distortion between the interposer 440 and the printed circuit boards 420 and 430 by an external impact or upon coupling to each other may be prevented.

Hereinafter, in describing conductive terminals 421, 431, 442, and 443 of the interposer 440 and two printed circuit boards 420 and 430 coupled to the interposer 440 according to various embodiments of the disclosure and an electrical connection structure through the conductive terminals 421, 431, 442, and 443, a detailed description of substantially the same components may be omitted.

Figure 8A:
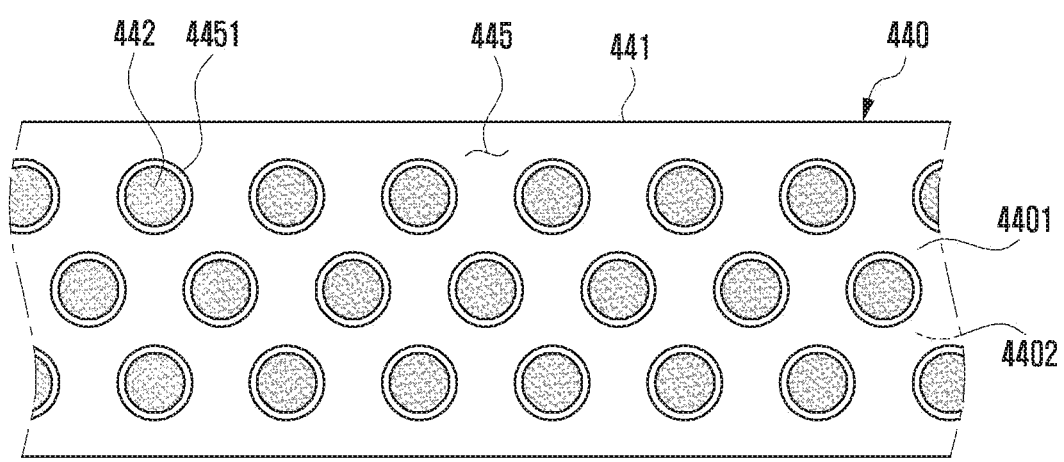
FIGS. 8A and 8B are partial plan views illustrating a configuration of an interposer according to various embodiments of the disclosure.
Figure 8B:
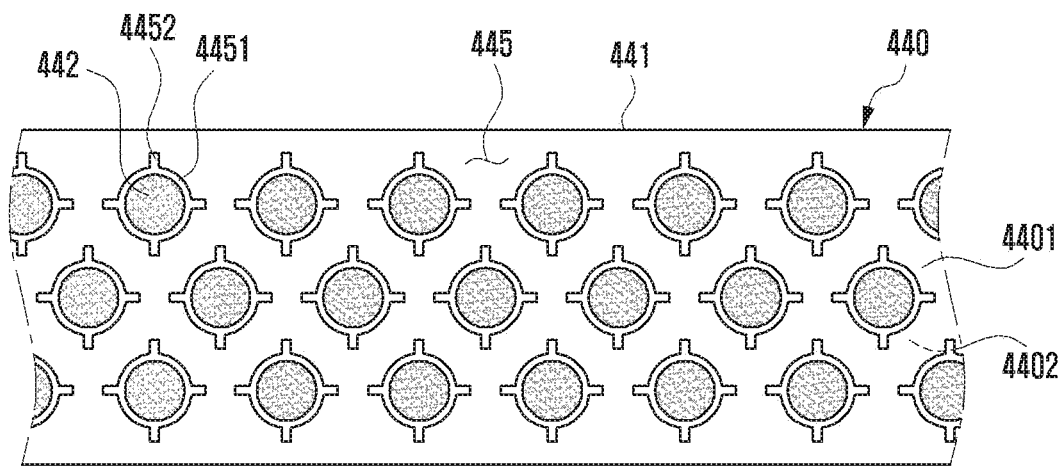

FIGS. 8A and 8B are partial plan views illustrating a configuration of an interposer 440 according to various embodiments of the disclosure.

Referring to FIGS. 8A and 8B, the interposer 440 is a connection failure prevention structure disposed around the conductive terminals 442 and may include a solder spread prevention structure. According to an embodiment, the solder spread prevention structure may include an overflow prevention portion 4451 disposed to enclose the conductive terminal 442. According to one embodiment, when the interposer 440 and two printed circuit boards 420 and 430 are coupled, the overflow prevention portion 4451 may help prevent an electrical short phenomenon that may occur when a pre-solder PS applied to one conductive terminal 442 contacts the pre-solder PS applied to the neighboring conductive terminal 442 in a reflow process. According to an embodiment, the overflow prevention portion 4451 may be formed in a closed loop shape so as to enclose the conductive terminal 442. In another embodiment, the overflow preventing portion 4451 generally encloses the conductive terminal, but may be formed in an open loop shape. In another embodiment, the overflow prevention portion 4451 may be formed in various shapes, such as a circular, elliptical, or polygonal shape. According to an embodiment, the interposer 440 may further include at least one branch structure 4452 extended outwardly in at least one point from the overflow prevention portion 4451. According to one embodiment, when the printed circuit boards 420 and 430 are coupled to the interposer 440, at least one branch structure 4452 may help prevent invading of a pre-solder PS that may overflow with neighboring terminals. In another embodiment, the overflow preventing portion 4451 may include at least two overflow preventing portions having the same center as that of the conductive terminal 442 and disposed to have different diameters while enclosing the conductive terminal 442. In this case, it is possible to prevent overflow of the pre-solder PS in double or triple through two or more overflow prevention portions.

According to various embodiments, the overflow prevention portion 4451 may be formed through partial omission of a cover layer 445 disposed at the first surface 4401 and the second surface 4402 of the interposer 440. For example, the cover layer 445 may include a photoresist layer disposed at the first surface 4401 and the second surface 4402 of the interposer 440. The cover layer or the protective layer means a protective member formed to protect a circuit, and may be configured with an insulating film (e.g., PI film; polyimide film). In another embodiment, in order to form the overflow prevention portion 4451, the cover layer 445 may include ink (e.g., peelable ink) cured after applying to the first surface 4401 and the second surface 4402 of the dielectric substrate 441 with a screen method.

According to one embodiment, the photoresist layer is a layer applied on a board or a thin film to form a photoresist film, and may then be selectively exposed to light through a mask. According to one embodiment, thermosetting ink may be used as the photoresist material. According to one embodiment, the thermosetting ink may be divided into areas that are cured by light and areas that are not cured by light, and be easily removed after being selectively exposed to light.

Figure 8C:
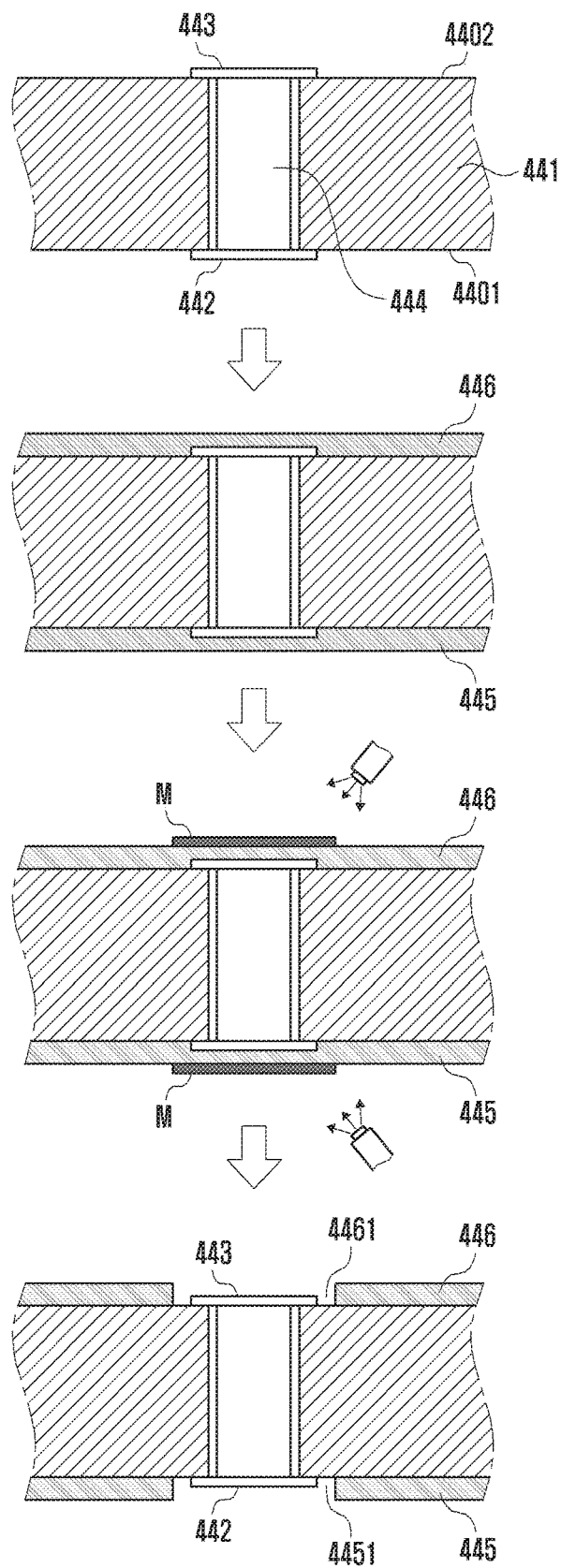
FIG. 8C is a diagram illustrating a process sequence of forming an overflow preventing portion according to an embodiment of the disclosure.

FIG. 8C is a diagram illustrating a process sequence of forming overflow preventing portions 4451 and 4461 according to an embodiment of the disclosure.

Referring to FIG. 8C, after a pre-treatment process of forming surfaces of the first surface 4401 and the second surface 4402 of the dielectric substrate 441, materials (e.g., cover layers 445 and 446) that may be formed with the overflow prevention portions 4451 and 4461 may be applied to the first surface 4401 or the second surface 4402. For example, liquid ink (e.g., liquid sr ink) or peelable ink that may be easily removed after a plating process may be applied by a screen printing method. After application, some areas including the conductive terminals 442 and 443 may be exposed to light for a predetermined time in a state covered by a mask M. After a certain period of time has elapsed, a portion exposed to light may be cured, and a portion covered through the mask M may be removed. In this case, the cured portion remains in some layers of the first surface 4401 or the second surface 4402, and the remaining portions may be formed with the overflow prevention portions 4451 and 4461 enclosing the conductive terminals 442 and 443.

Figure 9A:
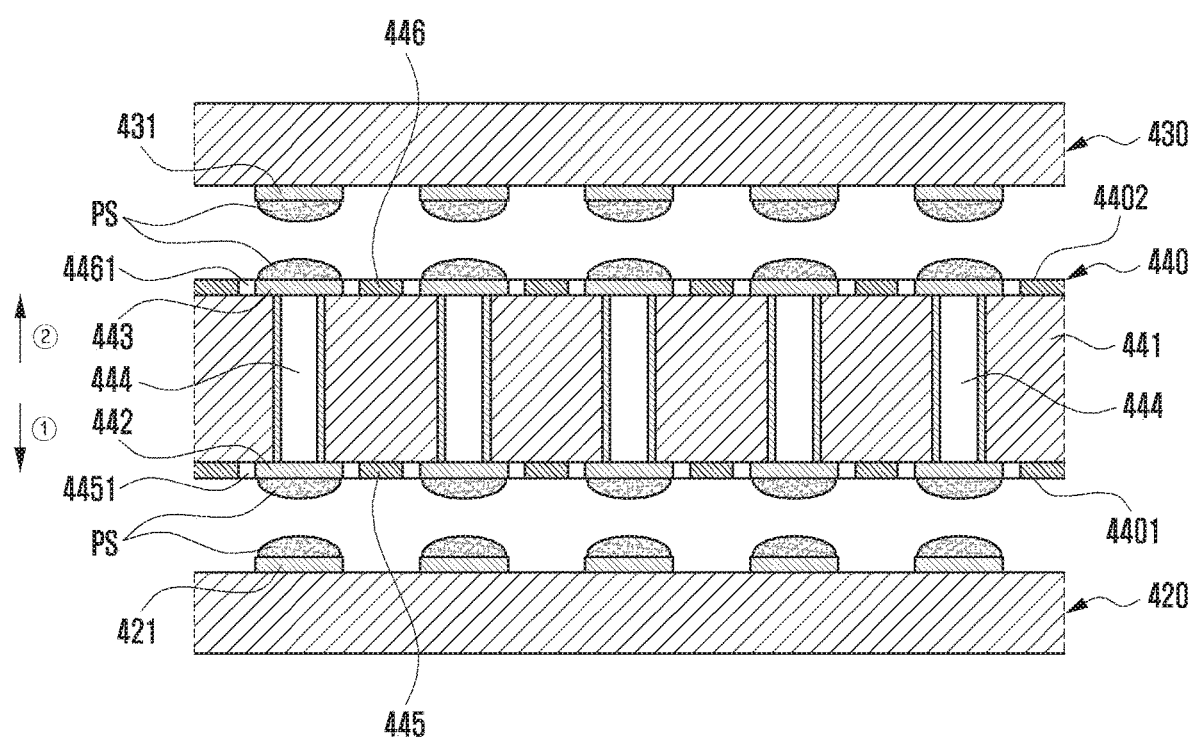
FIGS. 9A and 9B are partial cross-sectional views illustrating a configuration and a coupled state between an interposer and printed circuit boards according to various embodiments of the disclosure.
Figure 9B:
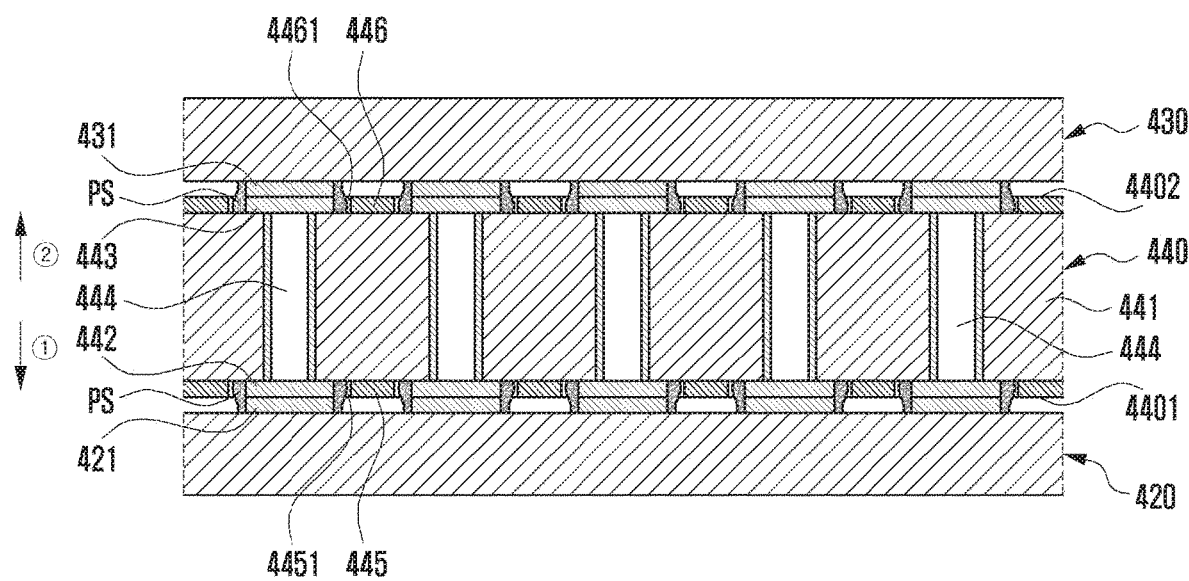

FIGS. 9A and 9B are partial cross-sectional views illustrating a configuration and a coupled state between an interposer 440 and printed circuit boards 420 and 430 according to various embodiments of the disclosure.

Referring to FIGS. 9A and 9B, an electronic device (e.g., the electronic device 400 of FIG. 4) may include an interposer 440 and two printed circuit boards 420 and 430 electrically connected to each other through the interposer 440. According to one embodiment, the first conductive terminal 421 of the first printed circuit board 420 may be electrically connected to the third conductive terminal 442 of the interposer 440 through the pre-solder PS. According to one embodiment, the second conductive terminal 431 of the second printed circuit board 430 may be electrically connected to the fourth conductive terminal 443 of the interposer 440 through the pre-solder PS. According to one embodiment, when the interposer 440 and the printed circuit boards 420 and 430 are coupled, the pre-solder PS may be invaded to a periphery thereof while electrically connecting the conductive terminals 421, 431, 442, and 443. In this case, the overflow prevention portion 4451 disposed around the conductive terminals 442 and 443 of the interposer 440 prevents the pre-solder PS invaded into the periphery from contacting the neighboring pre-solder PS, thereby helping prevent an electrical short phenomenon. According to one embodiment, the second surface 4402 of the interposer 440 may also include an overflow prevention portion 4461 formed by the cover layer 446 to be substantially the same as the first surface 4401 thereof.

Figure 10:
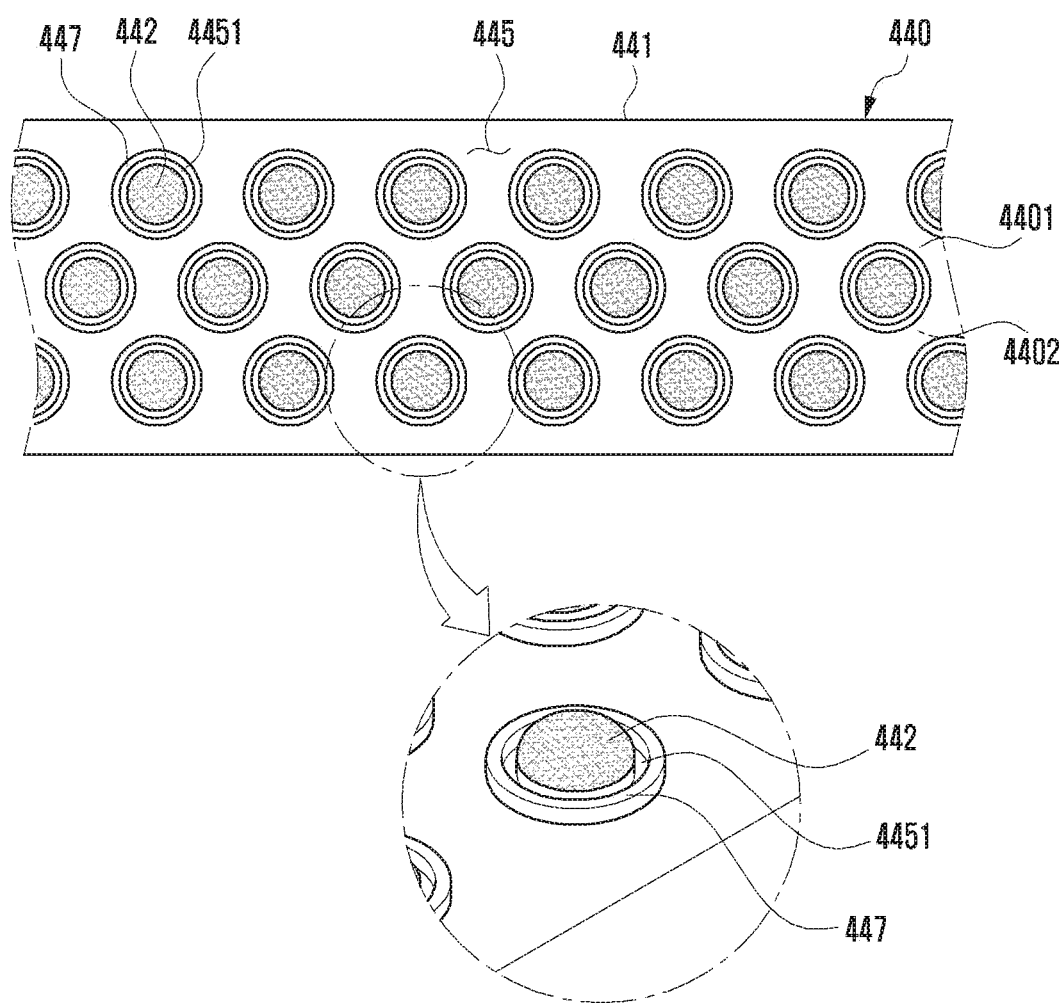
FIG. 10 is a partial plan view illustrating a configuration of an interposer according to an embodiment of the disclosure.

FIG. 10 is a partial plan view illustrating a configuration of an interposer 440 according to an embodiment of the disclosure.

Referring to FIG. 10, the interposer 440 is a connection failure prevention structure disposed around the conductive terminals 442 and may include a partition structure 447. According to one embodiment, when the interposer 440 and two printed circuit boards 420 and 430 are coupled, the partition structure 447 may serve to support to constantly remain a distance between the interposer 440 and the printed circuit boards 420 and 430. According to an embodiment, a height of the partition structure 447 may be equal to or higher than that of the conductive terminals. According to an embodiment, the partition structure 447 is disposed to be spaced apart from the conductive terminal 442 at a predetermined distance; thus, an overflow prevention portion 4451 may be formed between the partition structure 447 and the conductive terminal 442. According to one embodiment, the pre-solder applied to the conductive terminal 442 may be induced to the overflow prevention portion 4451 and be blocked through the partition structure 447; thus, the pre-solder may not be invaded to neighboring conductive terminals. According to one embodiment, the partition structure 447 may be formed in a closed loop shape so as to enclose the conductive terminal 442. In this case, the partition structure 447 may also perform an overflow prevention function of the pre-solder PS. In another embodiment, the partition structure 447 generally encloses the conductive terminal 442, but may be formed in an open loop shape. In another embodiment, the partition structure 447 may not enclose the conductive terminal 442 and may be disposed around the conductive terminal 442. According to one embodiment, the partition structure 447 may include a photoresist layer (PR layer) or peelable ink disposed at a predetermined height around the conductive terminal 442 in the dielectric substrate 441. According to one embodiment, the partition structure 447 may cure the peelable ink applied to at least one surface of the printed circuit boards 420 and 430, remove the uncured portion, and leave the cured portion.

Figure 11A:
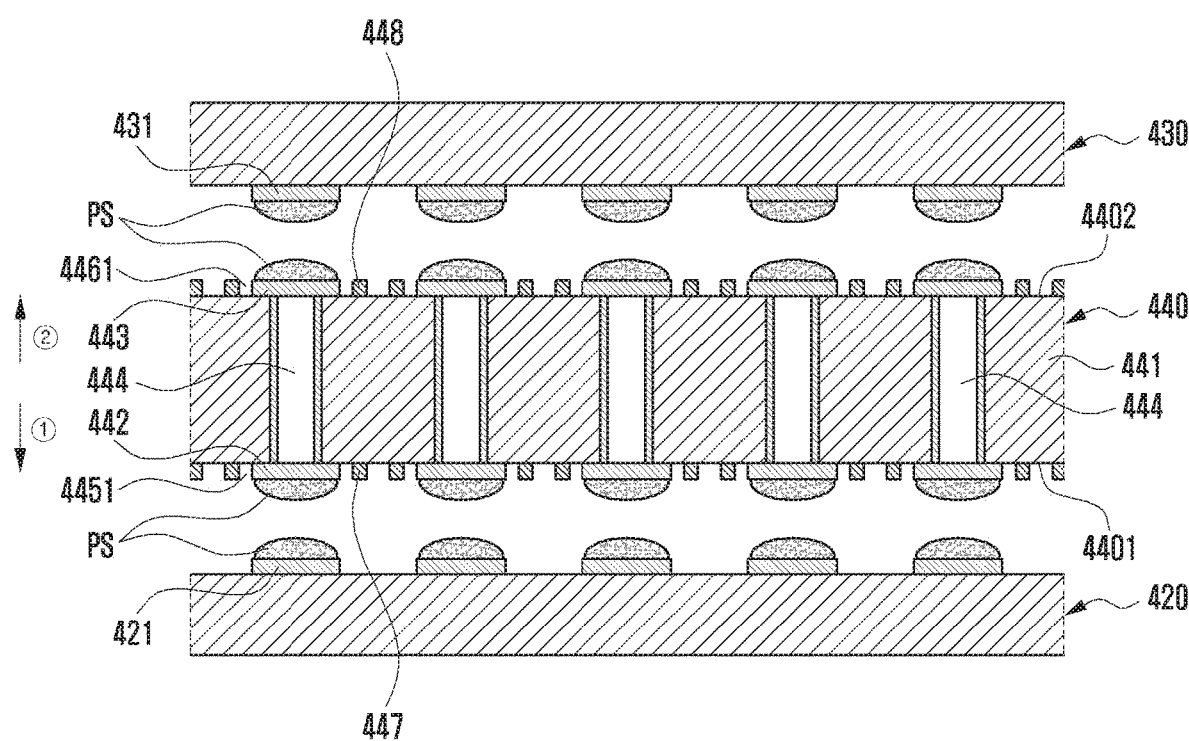
FIGS. 11A and 11B are partial cross-sectional views illustrating a configuration and a coupled state between an interposer and printed circuit boards according to various embodiments of the disclosure.
Figure 11B:
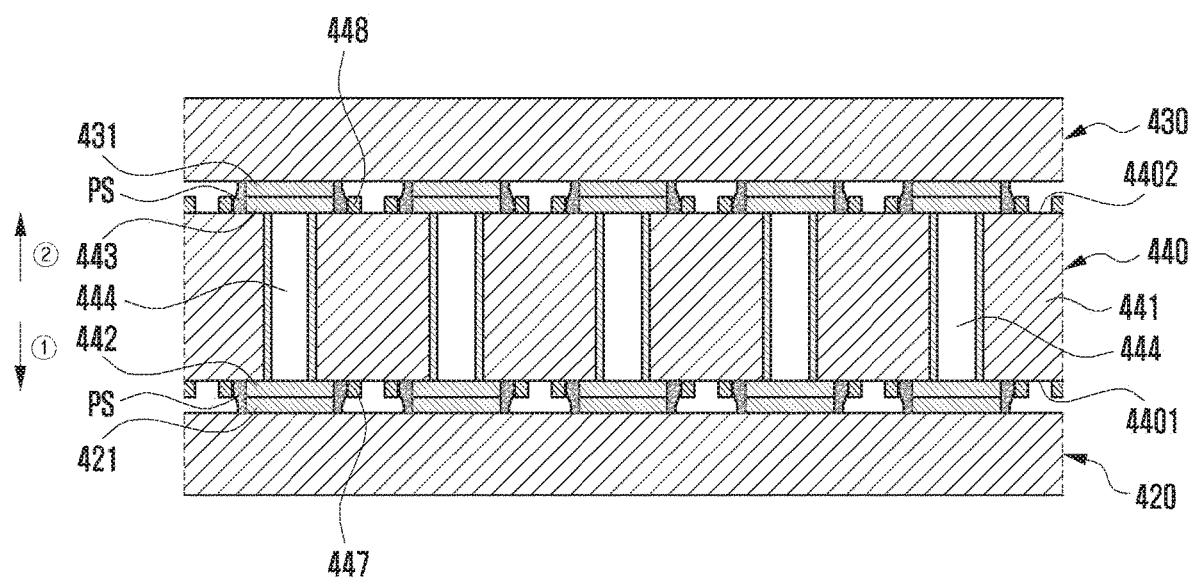

FIGS. 11A and 11B are partial cross-sectional views illustrating a configuration and a coupled state between an interposer 440 and printed circuit boards 420 and 430 according to various embodiments of the disclosure.

Referring to FIGS. 11A and 11B, an electronic device (e.g., the electronic device 400 of FIG. 4) may include an interposer 440 and two printed circuit boards 420 and 430 electrically connected to each other through the interposer 440. According to one embodiment, the first conductive terminal 421 of the first printed circuit board 420 may be electrically connected to the third conductive terminal 442 of the interposer 440 through a pre-solder PS. According to one embodiment, the second conductive terminal 431 of the second printed circuit board 430 may be electrically connected to the fourth conductive terminal 443 of the interposer 440 through the pre-solder PS. According to an embodiment, partition structures 447 and 448 may constantly support a distance between the interposer 440 and the printed circuit boards 420 and 430. According to one embodiment, the partition structures 447 and 448 may prevent overflow of the pre-solder PS invading from any one terminal to neighboring terminals.

Various embodiments of the disclosure provide an interposer including a modified structure for a pre-solder at a periphery of at least one terminal, thereby inducing smooth electrical contact between terminals through the pre-solder to help secure reliability of an electronic device.

According to various embodiments, an electronic device (e.g., the electronic device 400 of FIG. 4) includes a housing (e.g., the housing 110 of FIG. 1); a first printed circuit board (e.g., the first printed circuit board 420 of FIG. 6A) disposed in an internal space of the housing and including a plurality of first conductive terminals (e.g., the plurality of first conductive terminals 421 of FIG. 6A); and a second printed circuit board (e.g., the second printed circuit board 430 of FIG. 6A) disposed substantially parallel to the first printed circuit board in the internal space and including a plurality of second conductive terminals (e.g., the plurality of third conductive terminals 442 of FIG. 6A) electrically connected to the plurality of first conductive terminals, wherein the second printed circuit board includes at least some conductive terminals of the plurality of second conductive terminals or at least one connection failure prevention structure (e.g., the conductive support terminal 4421 of FIG. 6A) disposed around at least some conductive terminals.

According to various embodiments, the connection failure prevention structure may include at least one conductive support terminal (e.g., the conductive support terminal 4421 of FIG. 6A) disposed in a manner stacked on at least one surface of the plurality of second conductive terminals.

According to various embodiments, the at least one conductive support terminal may have as different sizes and be formed in at least two layers in each of the plurality of second conductive terminals.

According to various embodiments, the connection failure prevention structure may include an overflow preventing portion (e.g., the overflow preventing portion 4451 of FIG. 8A) disposed to enclose the at least one conductive terminal at a periphery of at least one conductive terminal of the plurality of second conductive terminals.

According to various embodiments, the overflow prevention portion may be formed through a cover layer (e.g., the cover layer 446 of FIG. 9A) disposed at the second printed circuit board.

According to various embodiments, the cover layer may include a photoresist layer disposed at the second printed circuit board.

According to various embodiments, the overflow preventing portion may be formed in a closed loop or a partially open loop shape disposed to enclose the at least one conductive terminal.

According to various embodiments, the electronic device may further include a branch structure (e.g., the partition structure 4452 of FIG. 8B) extended at least partially in a direction opposite to that of the at least one conductive terminal from the overflow preventing portion.

According to various embodiments, the connection failure prevention structure may include a partition structure (e.g., the partition structure 447 of FIG. 10) disposed around at least one conductive terminal of the plurality of second conductive terminals.

According to various embodiments, the partition structure may be formed in a closed loop or a partially open loop shape disposed to enclose the at least one conductive terminal.

According to various embodiments, the partition structure may be formed to have a height substantially equal to or higher than that of the at least one conductive terminal.

According to various embodiments, the partition structure may include a photoresist (PR) layer or peelable ink disposed higher than a surface of the second printed circuit board.

According to various embodiments, the electronic device may further include a third printed circuit board (e.g., the second printed circuit board 430 of FIG. 6A) disposed to face the first printed circuit board with the second printed circuit board interposed therebetween, wherein the second printed circuit board may include an interposer disposed to electrically connect the first printed circuit board to the third printed circuit board.

According to various embodiments, an interposer (e.g., the interposer 440 of FIG. 6A) may include a dielectric substrate (e.g., the dielectric substrate 441 of FIG. 6A) including a first surface (e.g., the first surface 4401 of FIG. 6A) and a second surface (e.g., the second surface 4402 of FIG. 6A) facing in a direction opposite to that of the first surface; at least one first conductive terminal (e.g., the plurality of third conductive terminals 442 of FIG. 6A) disposed at the first surface; at least one second conductive terminal (e.g., the plurality of fourth conductive terminals 443 of FIG. 6A) disposed at the second surface; and at least one support structure (e.g., the conductive support terminal 4421 of FIG. 6A) disposed around the at least one first conductive terminal and/or the at least one second conductive terminal.

According to various embodiments, the at least one support structure may include at least one conductive support terminal (e.g., the conductive support terminal 4421 of FIG. 6A) disposed in a manner stacked on one surface of at least one conductive terminal of the at least one first conductive terminal and/or the at least one second conductive terminal.

According to various embodiments, the at least one support structure may include a partition structure (e.g., the partition structure 447 of FIG. 10) disposed around at least one conductive terminal of the at least one first conductive terminal and/or the at least one second conductive terminal.

According to various embodiments, an electronic device (e.g., the electronic device 400 of FIG. 4) includes a housing (e.g., the housing 110 of FIG. 1); a first printed circuit board (e.g., the first printed circuit board 420 of FIG. 6A) disposed in an internal space of the housing and including a plurality of first conductive terminals (e.g., the plurality of first conductive terminals 421 of FIG. 6A); a second printed circuit board (e.g., the second printed circuit board 430 of FIG. 6A) disposed substantially parallel to the first printed circuit board in the internal space and including a plurality of second conductive terminals (e.g., the second conductive terminal 431 of FIG. 6A); and an interposer (e.g., the interposer 440 of FIG. 6A) disposed to electrically connect the first printed circuit board and the second printed circuit board between the first printed circuit board and the second printed circuit board, wherein the interposer includes a dielectric substrate (e.g., the dielectric substrate 441 of FIG. 6A) including a first surface (e.g., the first surface 4401 of FIG. 6A) and a second surface (e.g., the second surface 4402 of FIG. 6A) facing in a direction opposite to that of the first surface; a plurality of third conductive terminals (e.g., the plurality of third conductive terminals 442 of FIG. 6A) disposed to be electrically connected to the plurality of first conductive terminals at the first surface; a plurality of fourth conductive terminals (e.g., the plurality of fourth conductive terminals 443 of FIG. 6A) disposed to be electrically connected to the plurality of second conductive terminals at the second surface; and at least one solder overflow prevention structure (e.g., the overflow prevention portion 4451 of FIG. 8A) disposed around at least some conductive terminals of the plurality of first conductive terminals, the plurality of second conductive terminals, the plurality of third conductive terminals, and/or the plurality of fourth conductive terminals.

According to various embodiments, the solder overflow prevention structure may include an overflow prevention portion disposed to enclose the at least one conductive terminal at a periphery of at least one conductive terminal of the plurality of first conductive terminals and/or the plurality of second conductive terminals.

According to various embodiments, the overflow preventing portion may be formed through omission of at least some of a photoresist layer or thermosetting ink (e.g., peelable ink) disposed at the first surface and the second surface of the dielectric substrate.

According to various embodiments, the electronic device may further include at least one branch structure (e.g., the partition structure 4452 of FIG. 8B) extended at least partially in a direction opposite to that of the at least one conductive terminal from the overflow prevention portion.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a first printed circuit board disposed in an internal space of the housing and comprising a plurality of first conductive terminals; and
   a second printed circuit board disposed parallel to the first printed circuit board in the internal space and comprising a plurality of second conductive terminals electrically connected to the plurality of first conductive terminals,
   wherein the second printed circuit board comprises:
      at least some conductive terminals of the plurality of second conductive terminals, and
      at least one connection failure prevention structure disposed around the at least some conductive terminals of the plurality of second conductive terminals,
   wherein the at least one connection failure prevention structure comprises an overflow preventing portion disposed to at least partially enclose at least one conductive terminal at a periphery of the at least one conductive terminal of the plurality of second conductive terminals, wherein the overflow preventing portion comprises at least one support structure disposed around the at least one conductive terminal in the second printed circuit board and a recess at least partially formed by the at least one support structure, and wherein the at least one support structure is disposed to maintain a distance between the first printed circuit board and the second printed circuit board.

2. The electronic device of claim 1, wherein the connection failure prevention structure comprises at least one conductive support terminal stacked on at least one surface of the plurality of second conductive terminals.

3. The electronic device of claim 2, wherein the at least one conductive support terminal includes different sizes, and wherein the at least one conductive support terminal is formed in at least two layers in each of the plurality of second conductive terminals.

4. The electronic device of claim 1, wherein the overflow preventing portion comprises at least one of a circular, an elliptical, or a polygonal shape.

5. The electronic device of claim 4, wherein the overflow prevention portion is formed through a cover layer disposed at the second printed circuit board.

6. The electronic device of claim 5, wherein the cover layer comprises a photoresist layer disposed at the second printed circuit board.

7. The electronic device of claim 4, wherein the overflow preventing portion is formed in a closed loop or a partially open loop shape disposed to enclose the at least one conductive terminal.

8. The electronic device of claim 4, further comprising:
a branch structure extended at least partially in a direction opposite to that of the at least one conductive terminal from the overflow preventing portion.

9. The electronic device of claim 1, wherein the at least one support structure comprises a partition structure disposed around at least one conductive terminal of the plurality of second conductive terminals.

10. The electronic device of claim 9, wherein the partition structure is formed in a closed loop or a partially open loop shape disposed to enclose the at least one conductive terminal.

11. The electronic device of claim 9, wherein the partition structure is formed to have a height higher than that of the at least one conductive terminal.

12. The electronic device of claim 9, wherein the partition structure comprises at least one of a photoresist (PR) layer or peelable ink disposed higher than a surface of the second printed circuit board.

13. The electronic device of claim 1, further comprising:
a third printed circuit board disposed to face the first printed circuit board with the second printed circuit board interposed therebetween,
wherein the second printed circuit board comprises an interposer disposed to electrically connect the first printed circuit board to the third printed circuit board.

14. An interposer comprising:
a dielectric substrate including:
 a first surface, and
 a second surface facing in a direction opposite to that of the first surface;
at least one first conductive terminal disposed at the first surface;
at least one second conductive terminal disposed at the second surface; and
at least one connection failure prevention structure disposed around the at least one first conductive terminal and/or the at least one second conductive terminal,
wherein the at least one connection failure prevention structure comprises an overflow preventing portion disposed to at least partially enclose the at least one first conductive terminal and/or the at least one second conductive terminal at a periphery of the at least one first conductive terminal and/or the at least one second conductive terminal,
wherein the overflow preventing portion comprises at least one support structure disposed around the at least one first conductive terminal and/or the at least one second conductive terminal, and a recess at least partially formed by the at least one support structure, and
wherein the at least one support structure is disposed to maintain a distance between a first printed circuit board and second printed circuit board.

15. The interposer of claim 14, wherein the at least one support structure comprises at least one conductive support terminal stacked on one surface of at least one conductive terminal of the at least one first conductive terminal and/or the at least one second conductive terminal.

16. The interposer of claim 14, wherein the at least one support structure comprises a partition structure disposed around at least one conductive terminal of the at least one first conductive terminal and/or the at least one second conductive terminal.

17. An electronic device, comprising:
a housing;
a first printed circuit board disposed in an internal space of the housing and comprising a plurality of first conductive terminals;
a second printed circuit board disposed parallel to the first printed circuit board in the internal space and comprising a plurality of second conductive terminals; and
an interposer disposed to electrically connect the first printed circuit board and the second printed circuit board between the first printed circuit board and the second printed circuit board,
wherein the interposer comprises:
 a dielectric substrate comprising a first surface and a second surface facing in a direction opposite to that of the first surface,
 a plurality of third conductive terminals disposed to be electrically connected to the plurality of first conductive terminals at the first surface,
 a plurality of fourth conductive terminals disposed to be electrically connected to the plurality of second conductive terminals at the second surface, and
 at least one connection failure prevention structure disposed around at least some conductive terminals of the plurality of first conductive terminals, the plurality of second conductive terminals, the plurality of third conductive terminals, and/or the plurality of fourth conductive terminals,
wherein the at least one connection failure prevention structure comprises at least one solder overflow prevention structure disposed around the at least some conductive terminals of the plurality of first conductive terminals, the plurality of second conductive terminals, the plurality of third conductive terminals, and/or the plurality of fourth conductive terminals,
wherein the at least one solder overflow prevention structure comprises at least one support structure disposed around at least some conductive terminals of the plurality of first conductive terminals, the plurality of second conductive terminals, the plurality of third conductive terminals, and/or the plurality of fourth conductive terminals and a recess at least partially formed by the at least one support structure, and wherein the at least one support structure is disposed to maintain a distance between the first printed circuit board and the second printed circuit board.

18. The electronic device of claim 17, wherein the at least one solder overflow prevention structure is formed through a photoresist layer disposed at the first surface and the second surface of the dielectric substrate.

19. The electronic device of claim 18, further comprising:
at least one branch structure extended at least partially in a direction opposite to that of at least one conductive terminal from the at least one solder overflow prevention structure.

\* \* \* \* \*